United States Patent [19]

Rath

[11] Patent Number: 4,916,398
[45] Date of Patent: Apr. 10, 1990

[54] EFFICIENT REMOTE TRANSMISSION LINE PROBE TUNING FOR NMR APPARATUS

[75] Inventor: Alan R. Rath, Fremont, Calif.

[73] Assignee: Spectroscopy Imaging Systems Corp., Fremont, Calif.

[21] Appl. No.: 287,789

[22] Filed: Dec. 21, 1988

[51] Int. Cl.⁴ .............................................. G01R 33/20
[52] U.S. Cl. .................................................. 324/322
[58] Field of Search ............... 324/313, 314, 318, 322; 333/32, 33

[56] References Cited

U.S. PATENT DOCUMENTS 4,827,219  5/1989  Harrison .............................. 324/322

FOREIGN PATENT DOCUMENTS 3629356  3/1987  Fed. Rep. of Germany ...... 324/322
0031978  2/1986  Japan .................................... 324/313

Primary Examiner—Michael J. Tokar
Assistant Examiner—Kevin D. O'Shea
Attorney, Agent, or Firm—Stanley Z. Cole; Gerald M. Fisher; Edward H. Berkowitz

[57] ABSTRACT

The invention demonstrates remote tuning of an NMR probe over a length of transmission line while retaining very high efficiency relative to the equivalent locally turned coil. Fixed capacitances for partial tuning are employed at the load such that a desired range of efficiency is achievable for a selected range of capacitance values at both load and source for the intervening transmission line.

5 Claims, 3 Drawing Sheets

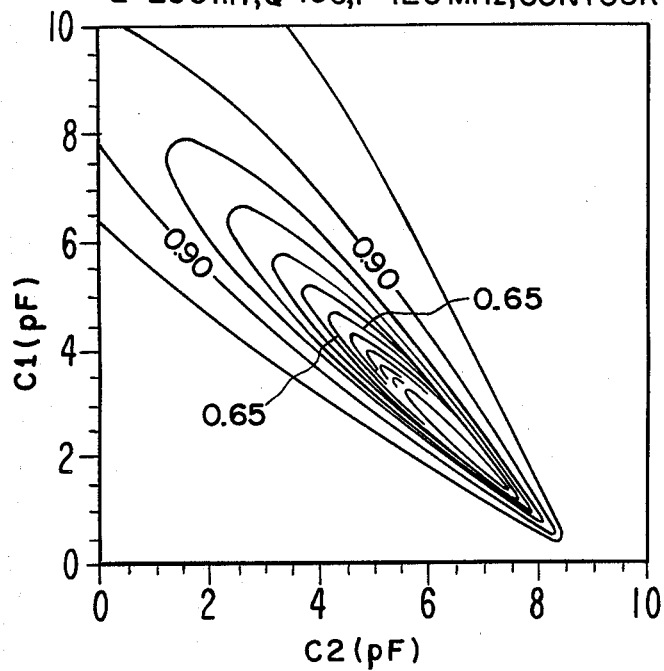
FIG.4 REFLECTION COEFFICIENT
L=200nH, Q=100, F=120MHz, CONTOUR INTERVAL=0.05
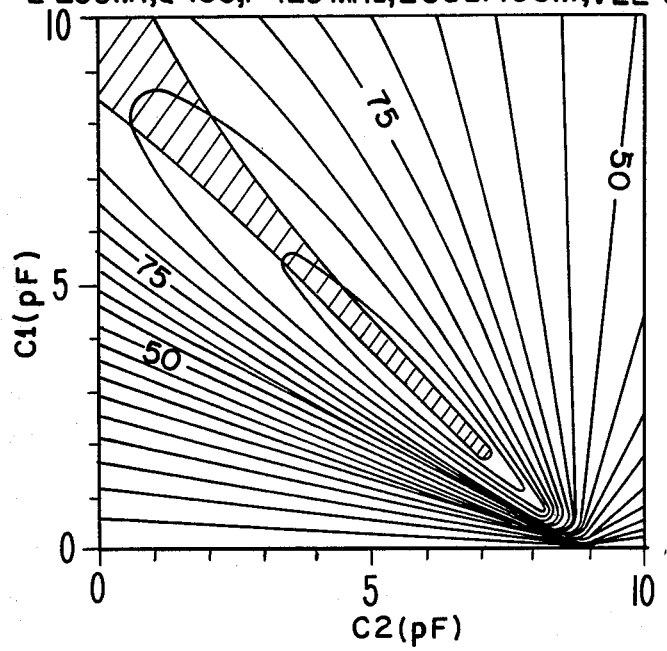
FIG.5 POWER EFFICIENCY
L=200nH, Q=100, F=120MHz, 20dB/100m, VEL=0.78

EFFICIENT REMOTE TRANSMISSION LINE PROBE TUNING FOR NMR APPARATUS

FIELD OF THE INVENTION

The invention is in the area of NMR apparatus and relates specifically to tuning of the NMR probe from a remote location.

BACKGROUND OF THE INVENTION

In NMR apparatus the probe coil is the means for transferring excitation energy to the sample and for picking up the signal emitted by de-exciting nuclei. The coil is carefully designed to be tuned for both functions and to disturb the homogeneity of the sample region as little as possible. The tuned coil should exhibit a high Q and must be carefully impedance matched to the preamplifier of the receiver and the RF source. The preamplifier is physically located at some distance from the coil and necessitates a cable in between, the latter having the characteristic impedance to match to devices placed at both its input and its output.

It is desirable to have the facility to tune rf transmitter/receiver coil(s) of an rf spectroscopic apparatus from a remote location, e.g., to avoid mechanical adjustments proximate the coil which may affect the rf properties of the coil in unexpected and uncontrolled fashion. In many applications, the accessibility of the rf coil is inconvenient for such adjustment in any event. Probe tuning is a major factor in the efficient operation of NMR apparatus. Such efficiency relates to energy transfer to and from the probe and depends largely on the degree to which the probe is electrically matched to the receiver preamplifier and/or the rf source.

In the prior art it is known to employ length of coaxial cable of length $d=\lambda/2$ connecting the coil to a remote tuning arrangement. This approach was discussed by Cross, Hester and Waugh, Rev. Sci. Inst., v. 47, pp. 1486 or 1488 (1976), as half of a double tuned single coil. Gordon and Tims, J. Mag. Res., v. 46, pp. 322–324 (1982), have discussed a similar arrangement wherein a length of cable and remote tuning capacitors are used to remotely tune a coil, which has first been tuned locally to one frequency, to a different second frequency. A pair of remote tuning capacitors are displaced remotely by an intervening length of cable d, chosen such that the remote tuning capacitors, arranged as a half-T network are of standard values given the cable impedance, the cable length d, the local capacitances and inductance of the coil.

In the present invention, the gross power dissipation is distributed between the external tuning means, the transmission line and the coil so as to minimize such dissipation in the external (remote) tuning means and cable and to maximize same in the rf coil. In order to accomplish this it is recognized that the efficiency with which rf power is transferred over the cable is managed advantageously by choosing local fixed capacitances at the rf coil which effect a small reduction of the reflection coefficient which obtains between the transmission line and the rf coil.

BRIEF DESCRIPTION OF THE DRAWINGS

FIG. 4 is a contour plot of reflection coefficient as a function of capacitances 52 and 54 of FIG. 2.

FIG. 5 is a contour plot of efficiency as a function of capacitances 52 and 54 of FIG. 2.

DETAILED DESCRIPTION OF THE APPARATUS

Figure 1:
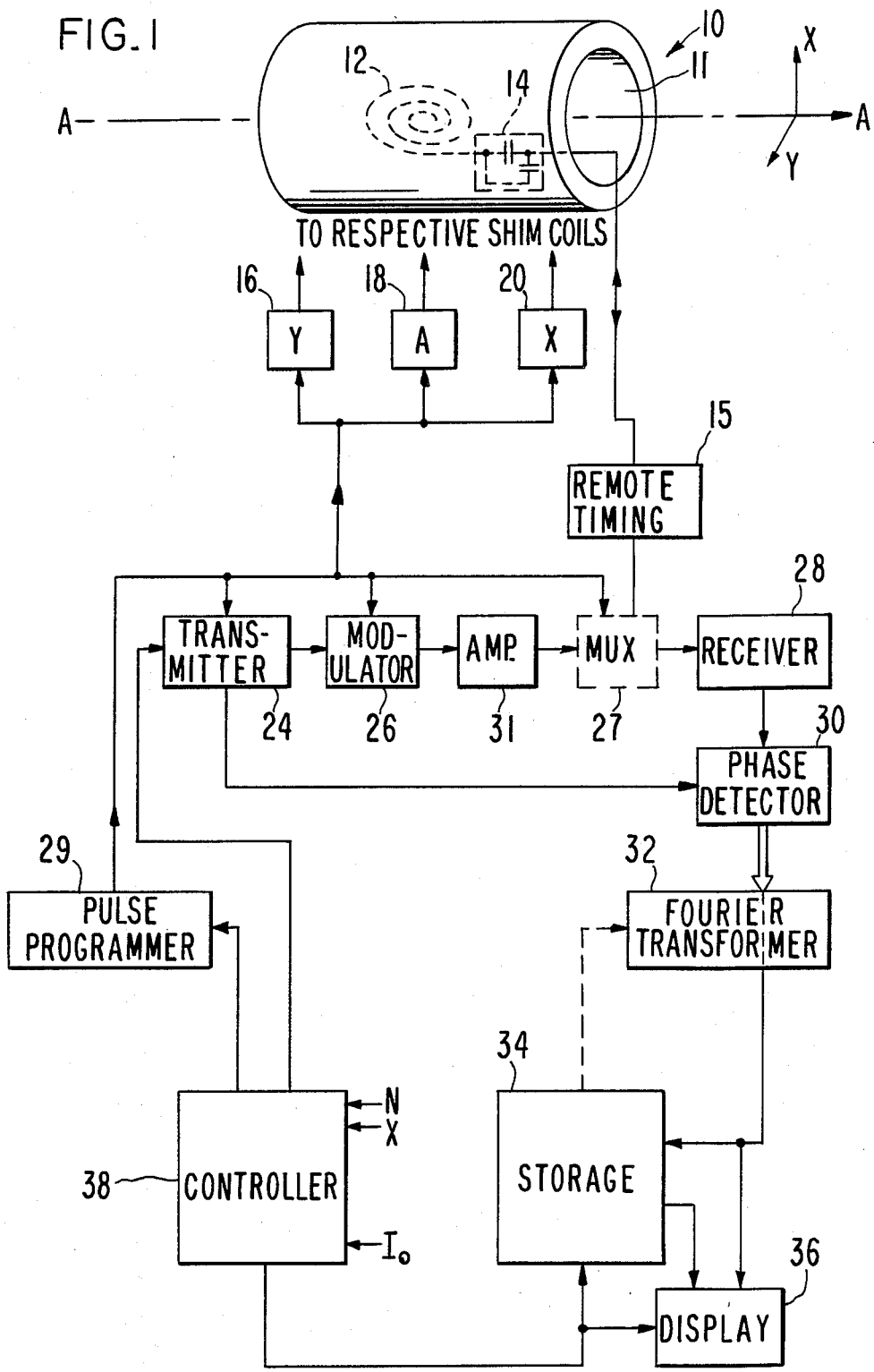
FIG. 1 is a schematic representation of the context of the invention.

Turning now to FIG. 1, there is shown an idealized NMR apparatus. A magnet 10 having bore 11 provides a main magnetic field. In order to control the magnetic field with precision in time and direction, there are provided magnetic field gradient coils (not shown). These are driven by gradient power supplies 16, 18 and 20, respectively. Additionally, other gradient coils (not shown) and power supplies (not shown) may be required for compensating residual undesired spatial inhomogeneities in the basic magnetic field. An object for analysis (hereafter "sample") is placed within the magnetic field in bore 11 and the sample is subject to irradiation by rf power, such that the rf magnetic field is aligned in a desired orthogonal relationship with the magnetic field in the interior of bore 11. This is accomplished through a transmitter coil in the interior of bore 11 and now shown in FIG. 1. Resonant signals are induced in a receiver coil, proximate the sample within bore 11 and also not shown.

As shown in FIG. 1, rf power is provided from transmitter 24, modulated through modulator 26 to yield amplitude modulated pulses of the rf power which are amplified by amplifier 31 and thence directed via multiplexer 27 to the rf transmitter coil 12 located within bore 11. Transmitter and receiver coils are clearly not concurrently active as such. The identical coil may be employed for both functions if so desired. Thus, a multiplexer 27 is provided to isolate the receiver from the transmitter. In the case of separate transmitter and receiver coils, element 27, while not precisely a multiplexer, will perform a similar isolation function to control receiver operation.

In the present invention, the rf coil 12 is partially tuned by local tuning network 14 and remotely tuned by remote tuning network 15.

The modulator 26 is controlled by pulse programmer 29 to provide rf pulses of desired amplitude, duration and phase relative to the rf carrier at preselected time intervals. The pulse programmer also controls the gradient power supplies 16, 18 and 20, if such gradients are required. These gradient power supplies may maintain selected static gradients in the respective gradient coils if so desired.

The transient nuclear resonance waveform is processed by receiver 28 and further resolved in phase quadrature through phase detector 30. The phase resolved time domain signals from phase detector 30 are presented to Fourier transformer 32 for transformation to the frequency domain in accordance with specific requirements of the processing. Conversion of the analog resonance signal to digital form is commonly carried out on the phase resolved signals through analog to digital converter (ADC) structures which may be regarded as a component of phase detector 30 for convenience.

It is understood that Fourier transformer 32 may, in practice, act upon a stored (in storage unit 34) representation of the phase resolved data. This reflects the common practice of averaging a number of time domain phase resolved waveforms to enhance the signal-to-noise ratio. The transformation function is then applied to the resultant averaged waveform. Display device 36 operates on the acquired data to present same for inspection. Controller 38, most often comprising one or more computers, controls and correlates the operation of the entire apparatus.

Figure 2:
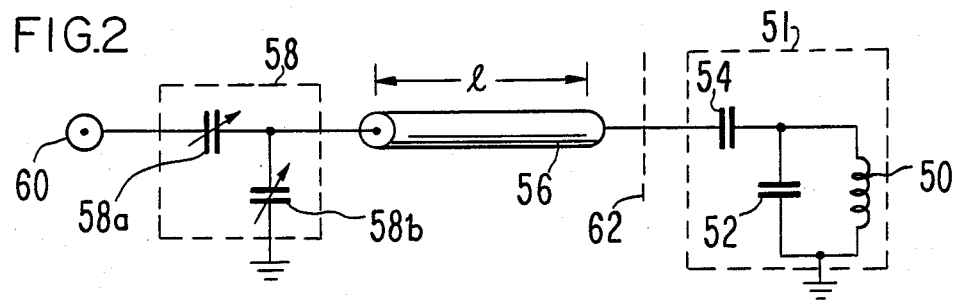
FIG. 2 shows an embodiment of the invention.

Turning now to FIG. 2 there is shown a schematic arrangement of probe coil 50 and local tuning capacitances, e.g., local parallel capacitor 52 and local series capacitor 54. A length l of transmission line, for example, coaxial cable 56 is interposed between capacitor 54 and a remote tuning network 58 from which a signal is derived/applied at connector 60. In the present invention the qualitative arrangement of FIG. 2 is identifiable with prior art but the quantitive aspect of the invention is quite distinct. In prior art, transmission line 56 and associated tuning means 58 are selected independently of a pre-existing circuit 51 for sole purposes of externally tuning resonant circuit 51 to a different resonant frequency, but without regard for efficiency of power transfer from connector 60 to coil 50 at this new frequency. In the present invention, all elements of FIG. 2 are selected simultaneously, subject to constraints imposed to achieve high efficiency of rf power transfer.

In the prior art the load presented by coil 50 mainly presents a reactive impedance to cable 56 and at boundary 62, the reflection coefficient may approach unity unless careful attention is given to impedance matching. Consequently, there is a loss in the transmission line 56. The loss is an exponential function of the reflection coefficient characterizing the line properties, the frequency of the wave propagating therein and source and sink impedances. See Terman, "Radio Engineer Handbook, p. 187 (McGraw-Hill: 1943). FIG. 3 illustrates this dependence.

The loss may be lowered by reducing reflection coefficient $\rho$; but from the exponential dependence form it is apparent that a small reduction of $\rho$ produces a dramatic effect on the loss. It is not essential to constrain the probe tuning to achieve a precision impedance match.

Accordingly, the capacitors 52 and 54 are selected for reasonable and available values, whereby $\rho \leq 0.9$ and an approximate tuned condition obtains for coil 50. This choice for reduction of $\rho$ is not absolute but represents a reduction (from values approaching unity) which will suffice for the present purposes. The range of Q for the coil as seen from the end of line 56 (proximate tuning network 58) then defines a possible range of values for variable capacitors 58A and 58B. Thus, tuning network 58 consists of a vernier for the tuning accomplished locally at coil 50.

Consider a power source connected to a length l of transmission line characterized by attenuation constant $\alpha$ and phase constant $\beta$. The load impedance presented to the load end of the transmission line is $Z_L$ and the source impedance is $Z_0$. The impedance presented at the source is $$Z_s = Z_0[(Z_1 + Z_0 \tan h\gamma l)/(z_0 + Z_1 \tan h\gamma l)]$$

where $\gamma = \alpha + i\beta$. The current drawn for an applied voltage $V_s$ is $V_s/Z_s = I_s$. The voltage across and current through the load are $$V_1 = V_s \cos h\gamma l - Z_0 I_s \sin h\gamma l$$

$$I_1 = I_s \cos h\gamma l - (V_s \sin h\gamma l)/Z_0$$

The power dissipated at the load is related to power developed by the source ($P_{in}$) as ($P_{out}$)

$$P_{out}/P_{in} = \text{real}[V_s I_s^*]/\text{real}[V_1 I_1^*]$$

Figure 3A:
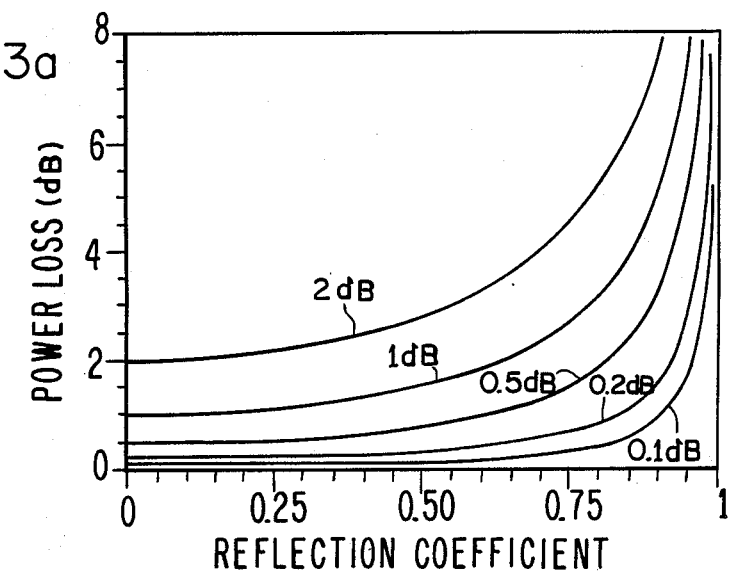
FIG. 3A shows the dependence of power loss in the transmission line as a function of reflection coefficient.

This relationship is the basis of FIG. 3A showing loss as a function of reflection coefficient.

Figure 3B:
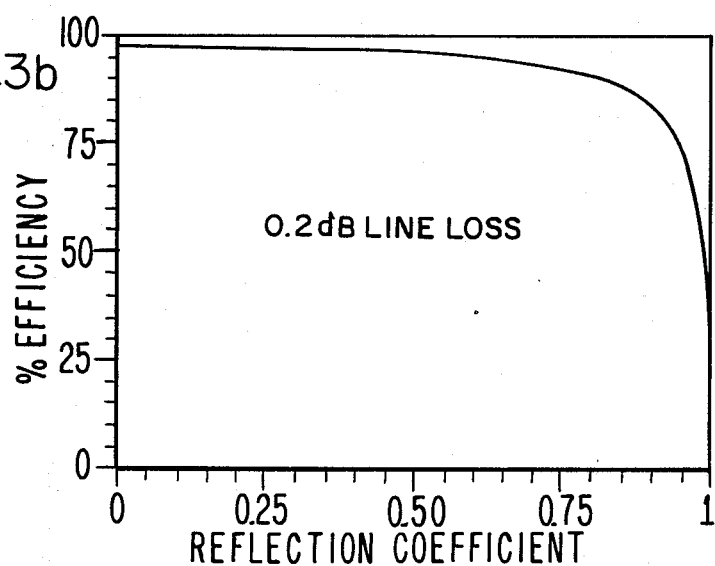
FIG. 3B shows the efficiency as a function of reflection coefficient for the 0.2 db line of FIG. 3A.

For a typical practical case, a one meter length of RG 58 coaxial cable would exhibit intrinsic loss of about 0.2 db at 120 MHz. In this case, FIG. 3B presents an alternative representation of the behaviour of the line in terms of the "efficiency" of power transfer between source and load over the line.

The reflection coefficient $\rho$ is established as a result of impedance mismatch:

$$\rho = (Z_1 - Z_i)/(Z_1 + Z_i)$$

where the subscript "1" refers to the load and the subscript "i" refers to the source, in this case the transmission line terminal adjacent the load. For a typical arrangement of a 200 nh coil 50 exhibiting a Q=100 at 120 MHz. connected to a 50Ω line, one finds that $\rho = 0.994$ and most power supplied to the transmission line is reflected back down the line toward the source with the result that only a small fraction of the power is dissipated in the load.

Very strong dependence of efficiency on $\rho$ suggests that a small reduction in the magnitude of $\rho$ will furnish a very large increase in efficiency as shown in FIG. 3B. Thus, values for fixed tuning capacitors 52 and 54 are selected to "approximately" tune and match coil 50 (of known inductance and Q) to line 56. For reasonable values of the capacitances 52 and 54 the reflection coefficient may be computed and displayed as a contour plot such as exhibited in FIG. 4.

"Approximately" has the meaning of achieving an impedance mismatch no worse than a selected reflection coefficient would produce, for example, values of reflection co-efficient in the range from 0.65 to no greater than substantially 0.9. (This range of $\rho$ corresponds to a voltage standing wave ratio in the range from 5 to about 20). In a mathematical space defined by the independent variation of local capacitances 52 and 54, the quantity $\rho \leq 0.9$ defines a surface region of the local capacitance space. The transmission line length, l, may be assigned an acceptable value and tuning elements 58A and 58B assigned acceptable ranges of values. Next, the relative efficiency, e.g., the efficiency in relation to an ideal local tuned network (such as circuit means 51 in isolation), is calculable from the data of FIG. 4 with the constraints of values for l and ranges for capacitances 58A and 58B thereby defining a region for remote tuning which can be achieved with the desired limit on reflection coefficient. This is shown in FIG. 5 for a transmission line length range of 40 cm to 100 cm. The shaded region describes a space which is not attainable with the limits selected for the cable length and external tuning elements. The desired region falls outside this shaded area, but inside an arbitrarily selected efficiency contour, say 80%.

The above described partial matching approach has been demonstrated with construction and testing of three probes, each utilizing the same 2.5 cm, 2 turn, 200 nh surface coil and each tuned to 120 MHz. The Q of the isolated coil was measured to be about 240 using a Hewlett-Packard 4191A impedance analyzer. The first probe was tuned in the conventional manner, using variable capacitors directly connected to the coil. The second probe was made to be remotely tuned by the addition of an electrical half wavelength of RG-58 coaxial cable (81 cm in length, 16.5 db/100 m attenuation, 0.66 velocity factor) inserted between the coil and the variable tuning capacitors. The third probe was constructed according to the design criteria outlined above which resulted in a cable length of 42 cm (16.2 db/100 m, 0.78 velocity factor), with capacitances 52 and 54 given values of 3.9 pf and 4.5 pf, respectively. The measured Q's of these three probes were 140, 60 and 30.

The efficiency of each probe was evaluated by measuring the 90° pulse length of a small sample of dilute potassium phosphate placed at the center of the coil. A number of different power levels were used, and results compared using the conventional probe as reference. The theoretical efficiencies of the two remotely tuned probes were determined as well, using the values of the components as given and assuming ideal loss-less capacitors. The theoretical efficiency of the half wavelength probe should be about 30% and the partially matched probe about 90%, both with reference to the conventional probe. These calculated values are in fairly good agreement with measured efficiencies. The data are shown in Table I below:

TABLE 1

Pulse Length and Relative Efficiency

| Power | Conventional | Pulse Length ($\mu$sec) $\lambda/2$ | Partial Match |
|---|---|---|---|
| 5 w | 79 | 240 | 85 |
| 9 w | 57 | 170 | 60 |
| 15 w | 43 | 127 | 47 |
| 27 w | 31 | 95 | 34 |
| Average Efficiency: | — | 33% | 93% |
| Theoretical Efficiency: | — | 30% | 90% |

It is apparent that by selection of the proper values of fixed capacitors, efficiency greater than 80% can normally be realized, even over a range of loaded and unloaded conditions. Some reduction in reflection coefficient may also be obtained with a somewhat simpler approach, such as the use of a single fixed capacitor of the proper value placed in series with the coil. Under this approach, efficiency can typically be realized in the 60% to 80% range.

What is claimed is:

1. An NMR apparatus for exciting and detecting rf resonance of gyromagnetic resonators in a sample, comprising:

polarizing magnet means for establishing a magnetic field wherein said resonators precess, rf source means for furnishing an rf magnetic field for application to precessing resonators, thereby to transfer energy to said resonators through an excitation process, rf receiver means for acquiring from said resonators a transient signal corresponding to a de-excitation process, probe means comprising rf coil means for transferring rf power between said rf source and said sample, said probe means comprising an rf coil disposed proximate said sample and a transmission line means for transport of rf power between said rf coil and said rf source, fixed local tuning means disposed between said coil and said transmission line means for partially matching the transmission line means to the rf coil and approximately tuning said rf coil to a resonant condition at a preselected frequency, said partial matching characterized by a reflection coefficient in the range from approximately 0.65 to no greater than substantially 0.9, remote variable tuning means disposed between said transmission line and said rf source, said remote variable tuning means for further tuning said rf coil to said resonant condition, whereby the approximate tuning is supplemented by said remote variable tuning means to closely approach an exact resonant condition for dissipation of rf power in said rf coil.

2. An NMR apparatus comprising an rf source for NMR excitation of gyromagnetic resonators and an rf detector for acquiring a signal from the de-excitation of said gyromagnetic resonators, comprising:

(a) an rf coil having inductance L connected in combination with first capacitor of fixed capacitance $C_1$ in parallel therewith and exhibiting one common connection of said rf coil and said first capacitance, said common connection connected to ground, and second capacitor of fixed capacitance $C_2$ in series with said combination, (b) transmission line means having a probe end and a remote end for communicating at the probe end thereof in series relationship with said second capacitor and communicating at the remote end with remote tuning means, said first and second capacitors and said rf coil and said transmission line comprising probe means resonant at frequency $\omega_0$ and said rf coil configured to surround an object to be studied, whereby in the presence of said object the resonant frequency of said probe means in combination with said object to be $\omega$, $\omega \neq \omega_0$ and $\omega/\omega_0 \approx 1$, said remote tuning means comprising third and fourth capacitors of variable capacity, each of said capacitors having first and second terminals, said first terminal of said third nd fourth capacitors commonly joined and connected to said remote end of said transmission line, said second terminal of said third capacitor connected to ground, said second terminal of said fourth capacitor adapted to communicate with either said rf source or said rf detector.

3. The NMR apparatus of claim 2 wherein said probe means exhibits a voltage standing wave ratio greater than 5 and not substantially greater than 20 as ascertained when an rf source is connected directly to the remote end of said transmission line in lieu of said remote tuning means.

4. The NMR apparatus of claim 3 wherein each said third and fourth capacitor cover a range of capacitance sufficient to cause said probe means to reach a resonant condition with at least 80% of said rf power dissipated in said rf coil.

5. The method of tuning an rf probe of an rf apparatus for the study of a class of approximately similar objects at a selected frequency, comprising:

(a) constructing the combination of an rf resonance circuit with transmission line appended thereto, and including the step of selecting the parameters of said rf resonance circuit and transmission lines whereby said rf resonance circuit is approximately resonant at said selected frequency for one said object, and approximately impedance matched to said transmission line with a reflection coefficient in the range from approximately 0.65 to substantially 0.9, (b) connecting a remote end of said transmission line to a common terminal of an L network of at least two variable capacitors, said network having two further terminals and connecting an rf source to the first terminal of said L network, and connecting the second terminal of said L network to ground, including the step of selecting the range of each said variable capacitor whereby a resonant condition of said rf resonant circuit is obtainable with at least 80% of the rf power supplied from said rf source to said rf circuit dissipated in said rf resonant circuit.

* * * * *